United States Patent
Fang et al.

(10) Patent No.: US 6,820,029 B2
(45) Date of Patent: Nov. 16, 2004

(54) METHOD FOR DETERMINING FAILURE RATE AND SELECTING BEST BURN-IN TIME

(75) Inventors: Walx Fang, Kaohsiung (TW); Charlie Han, Hsin-Chu (TW)

(73) Assignee: United Microelectronics Corp. (TW)

( * ) Notice: Subject to any disclaimer, the term of this patent is extended or adjusted under 35 U.S.C. 154(b) by 88 days.

(21) Appl. No.: 09/742,224

(22) Filed: Dec. 22, 2000

(65) Prior Publication Data

US 2002/0082796 A1 Jun. 27, 2002

(51) Int. Cl.⁷ .............................................. H01L 21/66
(52) U.S. Cl. ........................................ 702/120; 716/4
(58) Field of Search ..................... 702/117–120, 81, 702/87; 716/4; 438/17–18; 324/527–528, 760

(56) References Cited

U.S. PATENT DOCUMENTS

| | | | |
|---|---|---|---|
| 4,857,833 A | * 8/1989 | Gonzalez et al. | 324/512 |
| 5,030,905 A | 7/1991 | Figal | 324/760 |
| 5,204,618 A | 4/1993 | Matsuoka | 324/158.1 |
| 5,539,652 A | * 7/1996 | Tegethoff | 703/14 |
| 5,777,891 A | * 7/1998 | Pagano et al. | 702/39 |
| 5,798,653 A | 8/1998 | Leung, Jr. | 324/760 |
| 5,822,218 A | 10/1998 | Moosa et al. | 716/4 |
| 6,055,463 A | * 4/2000 | Cheong et al. | 700/223 |
| 6,223,098 B1 | * 4/2001 | Cheong et al. | 700/223 |
| 6,377,897 B1 | 4/2002 | Boyington et al. | 702/81 |
| 6,556,512 B1 | * 4/2003 | Winkler | 368/47 |

OTHER PUBLICATIONS

Chien et al., "A Nonparametric Approach to Estimating System Burn–in Time", IEEE Transactions on Semiconductor Manufacturing, vol. 9, No. 3, Aug. 1996, pp. 461–467.
Chien et al., "Modeling & Maximizing Burn–in Effectiveness", IEEE Transactions on Reliability, vol. 44, No. 1, Mar. 1995, pp. 19–25.

* cited by examiner

Primary Examiner—Marc S. Hoff
Assistant Examiner—Mary Catherine Baran

(57) ABSTRACT

A method for determining failure rate and selecting a best burn-in time is disclosed. The method comprises the following steps. First of all, integrate circuits are provided. Then a life-time testing process is performed, wherein a failure rate versus testing time relation is established by measuring the life-time of each integrated circuit under a testing environment, wherein an acceleration factor function also is established under the testing environment. Next a simulating process that uses a testing time function is performed to simulate the failure rate versus testing time relation. Then a transforming process that uses the acceleration factor function is performed to transform the testing time function into a real time function. Finally, an integrating process is performed to integrate the real time function through a calculating region to acquire an accumulated failure rate real time function.

11 Claims, 4 Drawing Sheets

METHOD FOR DETERMINING FAILURE RATE AND SELECTING BEST BURN-IN TIME

BACKGROUND OF THE INVENTION

1. Field of the Invention

The invention pertains to methods for determining failure rate and selecting best burn-in time which can provide both error range and risk estimation by numerical approach.

2. Description of the Prior Art

As the complexity of integrated circuits and the difficulties of market contest increase, quality and reliability of produced integrated circuits have became more important than ever. Therefore, how to control the qualities of produced integrated circuits, how to estimate failing risk of integrated circuits while they are used by end-users, and how to balance production cost and quality promise are some important challenges for the quality department of integrated circuits manufacturers.

In general, the relation between failure rate of integrated circuits and time, both for testing and for application of end-users, is usually called a bathtub curve. As shown in FIG. 1, with the increase of time (period), the bathtub curve can be divided into infant mortality period, normal life period and wear out period. Whereby, infant mortality period usually corresponds to failure induced by defects of fabrication, and usually lasts about several weeks; normal life period usually corresponds to some random failures, and usually lasts about twenty years, thirty years or more; wear out period usually corresponds to failure induced by long-time waste, and is continuously increased while time goes by.

Because most integrated circuits will have been replaced with new designs and new technologies before the wear out period is reached, manufacturers usually only need to test all produced integrated circuits through the infant mortality period to select all integrated circuit failures induced by imperfect fabrication. Thus, all tested integrated circuits are suitable for selling, and the only risk is some random failures. Moreover, elimination of these random failures and prolongation of normal life-time only can be achieved by improvements of fabrication of integrated circuits, can not be achieved by operation of quality department.

However, owing to limitation of time, it is impossible for the quality department to test all produced integrated circuits through both the infant mortality period and the normal life period, even only through the infant mortality period. As usual, the quality department only performs a stress test or an accelerated test to test produced integrated circuits through a specific period under a testing environment which is more harmful and dangerous for tested integrated circuits, and then the relation between the failure rate and testing time is measured. The difference between the testing environment and a normal operating environment is used to estimate the relation between failure rate and real time, which is the experienced time under the normal environment.

Indisputably, how to properly and correctly transform the failure rate versus testing time relation into the failure rate versus real time relation is the key about whether failure rate versus time relation can be properly acquired by the stress test.

Moreover, almost all well-known arts use mathematical formula to estimate the failure rate relation by some tested datas. For example, the popular mathematical formula is the chi square distribution: $\lambda = \chi^2[2(r+1)B]/2t$. Herein, $\lambda$ is the failure rate, $\chi$ is the chi square function, r is failing number, B is confidence and t is time, and value of $\chi$ is consulted from a pre-established table.

Significantly, because the failure rate versus time relation is acquired by referring to the formula in accordance with testing records, well-known arts have the following disadvantages: (1) the difference between the experimental value and the theoretical value can not be found by the used formula; (2) the best burn-in time only can be acquired by experience or formula, it can not be acquired by the relation between the best burn-in time and the corresponding risk; (3) the reliability of produced integrated circuits can not be assured by ensuring the estimated value which is almost the best value in accordance with the comparison between the experimental value and the theoretical value.

As a short summary, it is obviously that conventional arts can not efficiently determine the failure rate versus time relation and select the best burn-in time. Thus, it is necessary to develop a new method to analysis the testing records of the stress test and to effectively improve efficiency of quality department.

SUMMARY OF THE INVENTION

Objects of the present invention at least include providing a numerical method for providing both error range and risk estimation.

Objects of the present invention further comprise providing a method for controlling qualities of produced integrated circuits, estimating failing risk of users of produced integrated circuits, and balancing requirements of both production cost and quality promise.

On the whole, one method provided by the invention at least includes following basic steps: providing numerous integrated circuits; performing a life-time testing process, wherein a failure rate versus testing time relation is established by measuring the life-time of each integrated circuit under a testing environment, an acceleration factor function also is established under the testing environment, and the acceleration factor function is related to the relationship between a testing time of the testing environment and a real time of a normal operating environment; performing a simulating process that a testing time function to simulate the failure rate versus testing time relation; performing a transforming process by using the acceleration factor function to transform the testing time function into a real time function, wherein a knee point of the real time function corresponds to an operation time which is the best burn-in time; and performing an integrating process to integrate the real time function through a calculating region to acquire an accumulated failure rate versus real time function, wherein the calculating region is a region in which the real time is larger than the best burn-in time.

Besides, while more than one integrated circuits are failed before the knee point, the method further comprises deleting part of testing records and re-calculating the best burn-in time until only one integrated circuit is failed before the knee point.

BRIEF DESCRIPTION OF THE DRAWINGS

Preferred embodiments of the invention are described below with reference to the following accompanying drawings.

DESCRIPTION OF THE PREFERRED EMBODIMENT

This disclosure of the invention is submitted in furtherance of the constitutional purpose of the U.S. Patent Laws "to promote the progress of science and useful arts" (Article 1, Section 8).

One major disadvantage of conventional arts is that parameters and functions such as chi square function are acquired from some pre-established tables, and the same pre-determined tables is used to analysis different testing records of different samples. It is indisputable that some external variables, which are not acquired from testing records, are used to calculate the failure rate versus time relation, and then the failure rate versus time relation can not be obtained only by testing records. The claimed invention presents a way to estimate the failure rate versus time relation only in accordance with testing records, and then only errors induced by estimating process will be an issue but errors induced by external variables will not be an issue.

Figure 2:
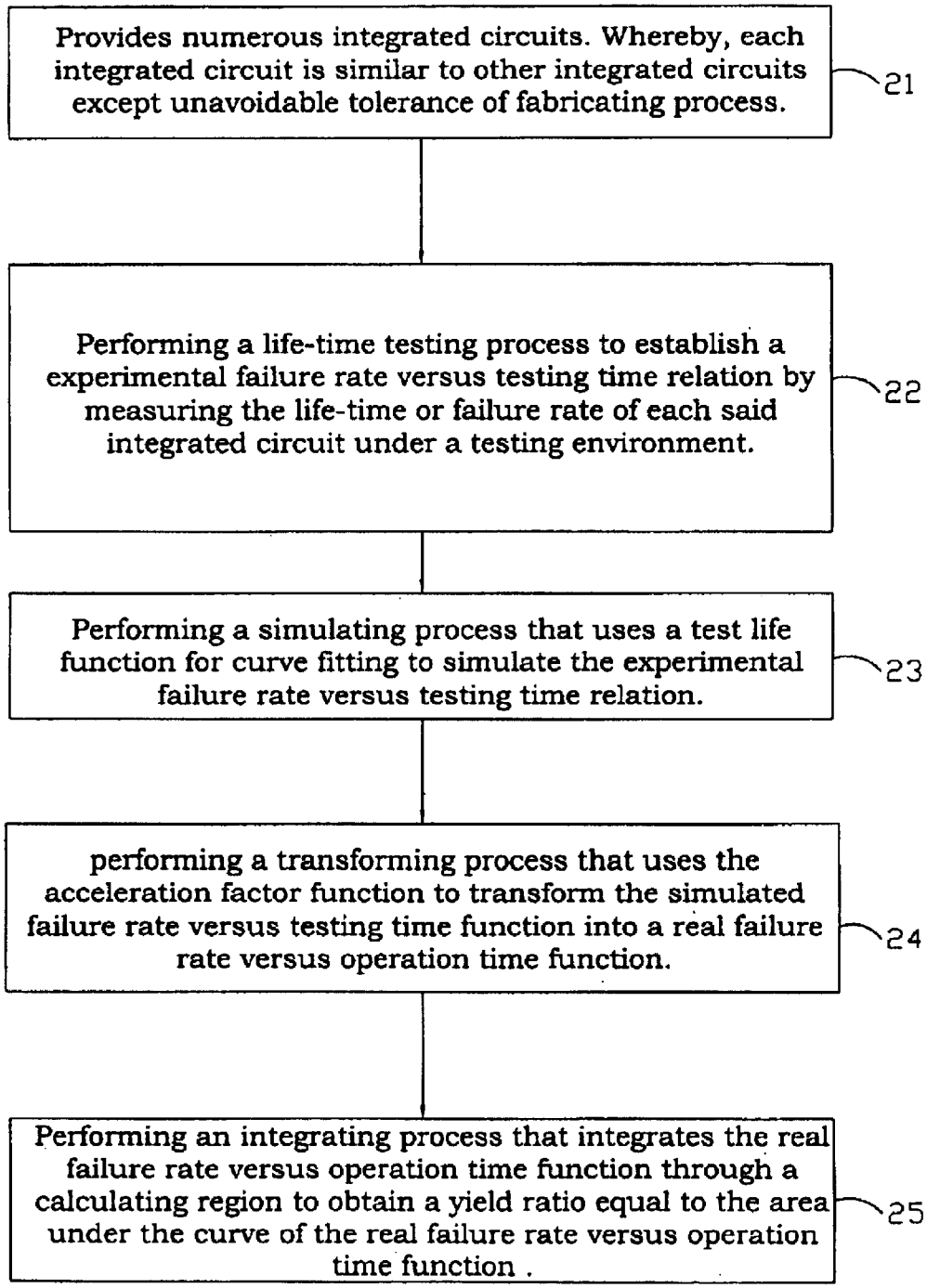
FIG. 2 is a brief flow chart of one preferred embodiment of this invention.

One preferred embodiment includes a method for determining failure rate and selecting a best burn-in time. As shown in FIG. 2, the embodiment comprises the following essential steps:

As shown in preparing block 21, numerous integrate circuits are provided. Whereby, each integrated circuit is similar to other integrated circuits except unavoidable tolerance of fabricating process.

Figure 1:
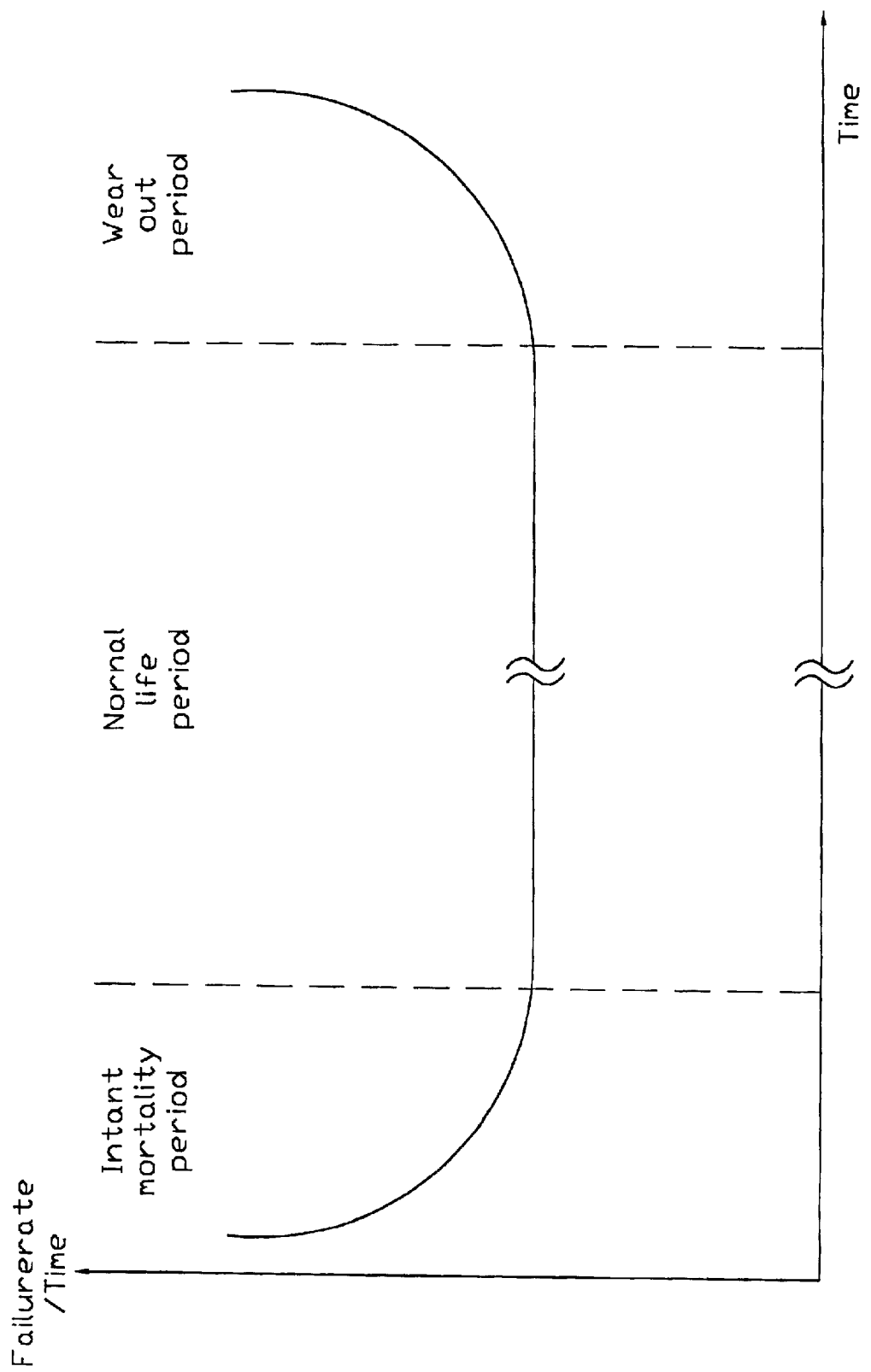
FIG. 1 is a brief illustration of the well-known relationship between failure rate and time for integrated circuits.

Life-time testing block 22 performs a life-time testing process to establish an experimental failure rate versus testing time relation by measuring the life-time or failure rate of each said integrated circuit under a testing environment which is well-known as a bathtub experiment having a curve of experiment data with the shape similar to FIG. 1. The bathtub curve can be divided into infant mortality period, normal life period and wear out period. Moreover, an acceleration factor function or an acceleration coefficient function of the bathtub experiment also is established under the testing environment. Moreover, the testing environment is adjusted to let (failure rate)/(unit time) in the testing environment larger than the (failure rate)/(unit time) in a normal operating environment, and in general it is achieved by increasing working voltage of integrated circuits, increasing temperature, increasing pressure or other ways. Obviously, contents of the acceleration factor function are decided by the difference between the testing environment and the normal operating environment, and the acceleration factor function could be a constant, a linear function or a nonlinear function. Further, as discussed above, the failure rate versus testing time relation can be divided into three periods in according to value of the testing time, the three periods are an infant mortality period, a normal life period and a wear out period.

As shown in simulating block 23, a simulating process that uses a test life function for curve fitting is performed to simulate the experimental failure rate versus testing time relation. Whereby, the simulating process is adjusted to let a difference, such as the least squares method, between the experimental failure rate versus testing time relation and the simulated failure rate versus testing time function is minimized. Moreover, because usually only the infant mortality period and the normal life period must be considered, and also owing to the hint of FIG. 1, the test life function for curve fitting usually is an exponent function, an equation of failure rate and testing time or $y=at^b$, wherein a and b are two parameters, y is the failure rate and t is the testing time. The parameters a and b can be obtained from the substitution of experimental data of failure rate and testing time for y and t. The simulated failure rate versus testing time function $y=at^b$ is then obtained, wherein parameters a and b are obtained from the experimental data of failure rate and testing time.

As shown in transforming block 24, a transforming process that uses the acceleration factor function is performed to transform the simulated failure rate versus testing time function into a real failure rate versus operation time function. Whereby the knee point of the real failure rate versus operation time function corresponds to an operation time which is the best burn-in time. Referring to FIG. 1, it is reasonable that while the difference between the simulated failure rate versus testing time function and the real failure rate versus operation time relation is properly minimized by the simulating process, the knee point should corresponds to the end of the infant mortality period and also corresponds to beginning of the normal life period.

As shown in integrating block 25, an integrating process that integrates the real failure rate versus operation time function through a calculating region is performed to acquire obtain a yield ratio (normal chip number) equal to the area under the curve of the real failure rate versus operation time function. Whereby, the calculating region is a region in which the real time is larger than the best burn-in time. Certainly, because integrated circuits usually are not operated in the wear out period, it is reasonable that integrating process ends when said testing time reaches said wear out period, and then result of the integrating process is the accumulated failure rate during the normal life period.

Obviously, because the claimed invention never uses any mathematical formula and never uses any external parameter which is not obtained from the testing records, and also because the claimed invention is a numerical approach method, it is reasonable that the claimed invention can decide the error range by trial and approach and also can decide the precision of the acquired obtained real failure rate versus operation time function.

Besides, because calculation and application of the knee point is a key point of the claimed invention, and because precision of knee point is directly proportional to cost of the claimed invention. Calculation is further discussed in following paragraphs.

First, the failure rate versus testing time relation is combined by numerous testing records, the failure rate versus real time relation also is combined by these testing records, and the only difference is the acceleration factor function.

Next, while more than one integrated circuits fail before a specific testing time in which is corresponding to the knee point, it usually is necessary to perform an optimization process that deletes part of testing records and performs corresponding processes. While only one integrated circuit fails before a specific testing time reaches the knee point, the specific testing time is a best testing time of these integrated circuits.

Figure 3A:
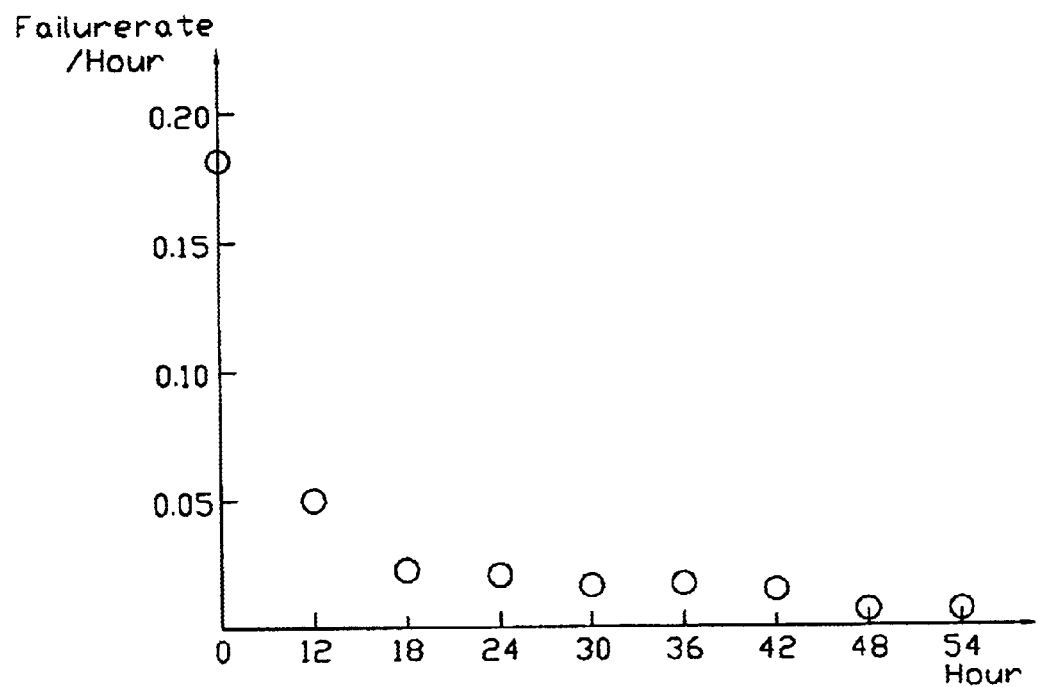
FIG. 3A through FIG. 3C are some referring figures for showing how to decide and find required knee point.
Figure 3B:
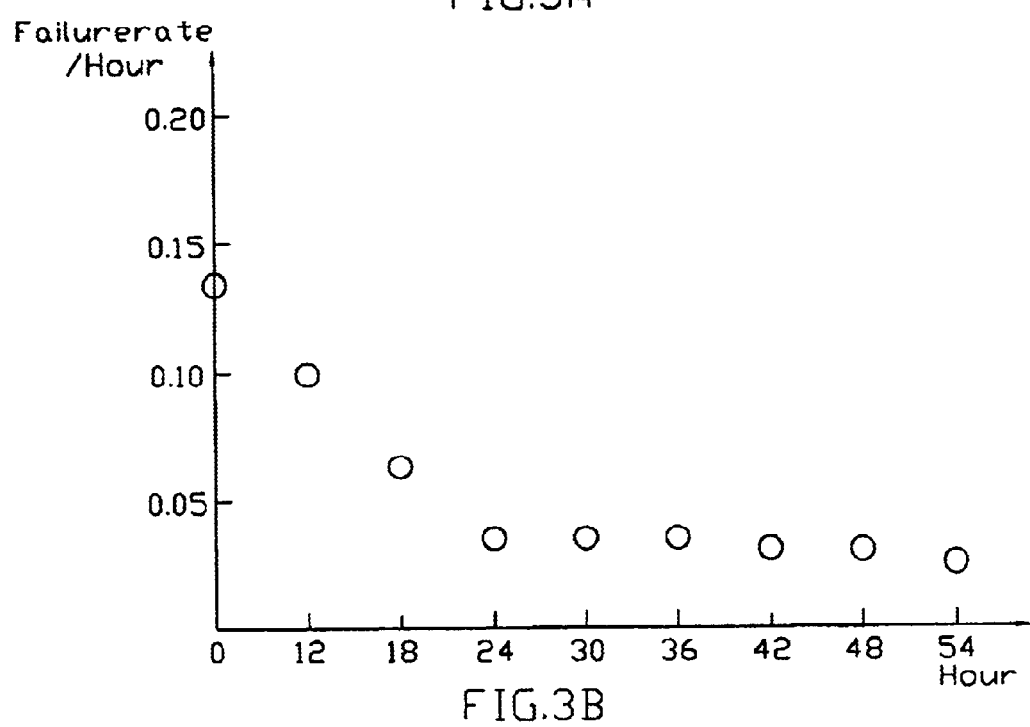
Figure 3C:
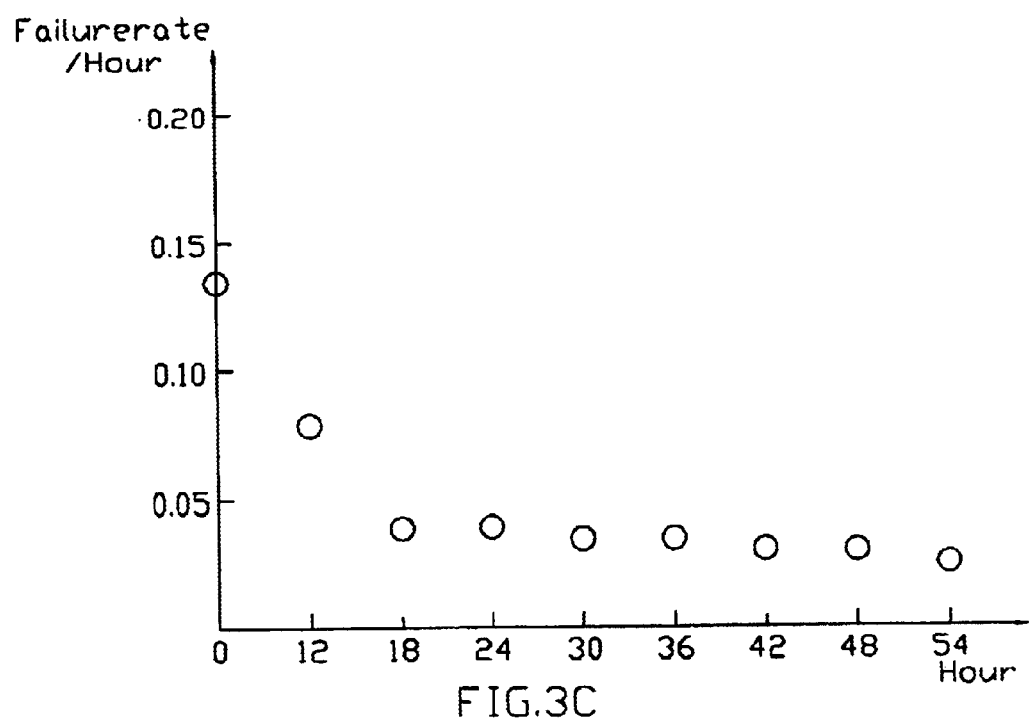

For example, the curve of the failure rate versus testing time relation as shown in FIG. 3A is formed by the following testing records 6 H-12 H-18 H . . . and so on, and it is obviously that the second testing record 12 H is a good knee point and no other obvious knee point is existent, and then the required time function can be acquired from the following testing records 6 H-12 H-23 H . . . and so on. However, while the curve of the failure rate versus test time relation as shown in FIG. 3B is formed by 6 H-12 H-18 H-24 H(knee point)-30 H . . . and so on, or while the curve of the failure rate versus testing time relation as shown in FIG. 3C is formed by 6 H-12 H-18 H(near knee point)-24 H(near knee point)-30 H . . . and so on, it is necessary to delete the first few testing records. For example, 6 H and 12 H are deleted for the curve of FIG. 3C and 6 H is deleted for the curve of FIG. 3B. And then the time function is calculated while the knee point is properly selected.

Without any question, while it is necessary to decrease the total failure probability of the integrated circuit used by an end-used during the normal life period, and while at least one testing record is existent after the knee point is reached, it is useful to move the knee backward to prolong the best burn-in time and decrease the normal life period. Moreover, while advantages of both prolonged best burn-in time and decreased failure probability can not cancel the disadvantages of both increased production cost and quality control cost, the claimed invention also provides some reliable information to notice both the production line and the customers that failure probability only can be decreased by improvements of fabrication.

Besides, while there are not enough testing records to ensure the precision of the knee point, the claimed invention can be further extended to test same integrated circuits several times and find the best knee point by all testing records of all tests.

Although specific embodiments have been illustrated and described, it will be obvious to those skilled in the art that various modifications may be made without departing from what is intended to be limited solely by the appended claims.

What is claimed is:

1. A method for determining failure rate and selecting a best burn-in time, comprising:

providing a plurality of integrated circuits;

performing a life-time testing process, wherein a failure rate versus testing time relation with an acceleration factor function is established by measuring the life-time of each said integrated circuit under a testing environment;

performing a simulating process by using a test life function for curve fitting to simulate said failure rate versus testing time relation and generate a simulated failure rate versus testing time function;

performing a transforming process, using said acceleration factor function to transform said simulated failure rate versus testing time function into a real failure rate versus operation time function, wherein a knee point of said real failure rate versus operation time function corresponds to an operation time which is said best burn-in time; and performing an integrating process, integrating said real failure rate versus operation time function through a calculating region to acquire a yield ratio.

2. The method of claim 1, wherein said failure rate testing time relation is divided into three periods in accordance with value of said testing time, said three periods are an infant mortality period, a normal life period and a wear out period.

3. The method of claim 2, wherein said integrating process is stopped while said testing time is located in said wear out period, said testing time being corresponding to said real time.

4. The method of claim 1, wherein said acceleration factor function is a constant.

5. The method of claim 1, wherein said acceleration factor function is a linear function.

6. The method of claim 1, wherein said acceleration factor function is a nonlinear function.

7. The method of claim 1, wherein said test life function for curve fitting is an exponent function.

8. The method of claim 1, wherein said testing time function for curve fitting is $y=at^b$, wherein a and b are two parameters, y is a failure rate and t is a testing time.

9. The method of claim 1, wherein said simulating process is adjusted to minimize the difference between said failure rate testing time relation and said test life function for curve fitting.

10. A method for determining failure rate and selecting best burn-in time, comprising:

providing a plurality of integrated circuits;

performing a life-time testing process, wherein the life-time of each said integrated circuit is measured under a testing environment and then a failure rate versus testing time relation with an acceleration factor function is established in accordance with a plurality of testing records;

performing a simulating process, using a testing life function for curve fitting of said testing time to simulated said failure rate testing time relation and generate a simulated failure rate versus testing time function;

performing an optimizing process, part of said testing records are deleted and said corresponding processes are performed again while more than one of said integrated circuits are failed before a specific testing time in which is corresponding to a knee point of said test life function for curve fitting, and said specific testing time is a best testing time of said integrated circuits while only one of said integrated circuits is failed before said specific testing time;

performing a transforming process by using said acceleration factor function to transform said specific testing time into a specific real time and also transform said test life function for curve fitting into a real failure rate versus operation time function, wherein said specific real time is a best burn-in time for testing said integrated circuits; and performing an integrating process, integrating said real failure rate versus operation time function through a calculating region to acquire a yield ratio.

11. The method of claim 10, wherein said integrating process is stopped while said testing time is located in said wear out period, said testing time being corresponding to said real time.

* * * * *